United States Patent [19]
Komatsu et al.

[11] Patent Number: 5,302,829
[45] Date of Patent: Apr. 12, 1994

[54] AUTOMATIC FOCUSING METHOD FOR SCANNING ELECTRON MICROSCOPY

[75] Inventors: Fumio Komatsu, Fuchu; Yasuhiro Kaga, Yokohama, both of Japan

[73] Assignee: Kabushiki Kaisha Toshiba, Kawasaki, Japan

[21] Appl. No.: 3,472

[22] Filed: Jan. 12, 1993

[30] Foreign Application Priority Data

Jan. 13, 1992 [JP] Japan .................................. 4-004021

[51] Int. Cl.$^5$ .............................................. H01J 37/26
[52] U.S. Cl. ...................................... 250/307; 250/310
[58] Field of Search ........................ 250/307, 310, 397

[56] References Cited

U.S. PATENT DOCUMENTS

| | | | |
|---|---|---|---|
| 3,937,959 | 2/1976 | Namae ................ | 250/310 |
| 4,514,634 | 4/1985 | Lawson .............. | 250/397 |
| 4,978,856 | 12/1990 | Akado ................ | 250/310 |
| 5,032,725 | 7/1991 | Kanda ................ | 250/310 |
| 5,084,618 | 1/1992 | Ito ...................... | 250/307 |
| 5,130,540 | 7/1992 | Yamada et al. ..... | 250/310 |
| 5,198,668 | 3/1993 | Yamada .............. | 250/310 |

FOREIGN PATENT DOCUMENTS 1-41157 2/1989 Japan .

*Primary Examiner*—Bruce C. Anderson
*Attorney, Agent, or Firm*—Foley & Lardner

[57] ABSTRACT

An automatic focusing method for scanning electron microscopy. A scanning electron microscope is set in a low magnification mode to detect a taper portion of an object to be observed. The beam scanning whose direction is perpendicular to the taper portion is effected whenever objective lens control condition is changed at a first pitch, and the secondary electron signals obtained under these conditions are converted into video signals. The video signals are differential smoothed to calculate a sum of video signal absolute values. On the basis of the sum of the absolute values, an optimum objective lens control condition in the low magnification mode can be obtained. Sequentially, the microscope is set to a high magnification mode, and the objective lens control condition is further changed at a second pitch within a predetermined range with the optimum control condition in the low magnification mode as the center of the range. The beam scanning whose direction is perpendicular to the taper portion is effected. In the same way as in the low magnification mode, the secondary electrons signal obtained under these conditions are converted into video signals to obtain the optimum objective lens control condition in the high magnification mode. The optimum control condition obtained in the high magnification mode is determined as the control condition to determine the focal distance of the objective lens.

3 Claims, 5 Drawing Sheets

AUTOMATIC FOCUSING METHOD FOR SCANNING ELECTRON MICROSCOPY

BACKGROUND OF THE INVENTION

The present invention relates to an automatic focusing method for scanning electron microscopy.

In a conventional scanning electron microscopy, the automatic focusing method has been attained in accordance with the following steps:

1) storing the secondary electron signals obtained by scanning electron beams at a constant speed in circular or linear scanning mode and further by varying the excitation condition of an objective lens at a predetermined rate;
2) obtaining either one of an integration value of variations in signal between adjacent pixels on a displayed picture or an addition of absolute values of differences in signal between adjacent pixels, on the basis of the stored secondary electron signals; and
3) obtaining an excitation condition of the objective lens in which the above-mentioned obtained value is maximized, to set the obtained excitation condition to the objective lens. (Set a central value of the excitation value width determined by a half of the maximum value to the objective lens by regarding the central value as the excitation condition in which the real maximum value can be obtained.)

In the above-mentioned conventional automatic focusing method since the electron beams are scanned at a constant speed in the circular or linear mode, where the boundary region (taper portion) of an object to be observed is located on the beam scanning lines, the components of topographic contrast are included to that extent in the obtained secondary electron signals, with a result that the automatic focusing precision is relatively high. In addition, when the beam scanning direction is perpendicular to the boundary region, it is possible to further improve the automatic focusing precision.

However, an object to be observed is generally located at any given position on the surface upon which the beams are irradiated. Therefore, in the case of the circular or linear scanning mode, the number of beams for scanning the boundary region of an object to be observed is not constant in the automatic focusing operation. Additionally, the topography of the object to be observed is not uniform, and further the boundary region is not always located along the direction perpendicular to the beam scanning direction. Accordingly, the topographic contrast components included in the obtained secondary signal fluctuate, thus resulting in a problem in that the precision of the automatic focusing operation is not stable.

Further, in the conventional automatic focusing method, since the automatic focusing operation is effected at a constant magnification (previously set by an operator usually), in case where the working distance between the objective lens and an object to be observed is changed markedly, there exists a problem in that the precision of the automatic focusing operation is often deteriorated.

SUMMARY OF THE INVENTION

With these problems in mind therefore, it is the object of the present invention to provide an automatic focusing method for scanning electron microscopy, which is high in the automatic focusing precision, irrespective of the topography of an object to be observed and a change in the working distance.

The automatic focusing method for scanning electron microscopy according to the present invention comprises the steps of: setting a scanning electron microscope in a predetermined low magnification mode to scan electron beams upon an object to be observed via an objective lens of the microscope; detecting first secondary electron signals from the object to convert the first electron signals into first video signals; smoothing and multivalue processing the first video signals to separate a signal component corresponding to a taper portion of the object, thus to detect a position of the taper portion; obtaining a beam scanning direction perpendicular to the taper portion to detect the beams in the obtained direction; changing a control condition of the objective lens at a first predetermined pitch to vary a focal distance of the objective lens, thus to detect second secondary electron signals obtained when the beam scanning is effected in the obtained direction for each first predetermined pitch and convert the second electron signals into second video signals; differential smoothing the second video signals to calculate a sum of absolute values of the second video signals for each first predetermined pitch, thus to determine a first excitation condition of the objective lens on the basis of the calculated sum of the absolute values of the second video signals; setting the microscope in a predetermined high magnification mode and changing the excitation condition at a second predetermined pitch within a predetermined range with the first excitation condition as a center of the range to vary the focal distance, thus to detect third secondary electron signals obtained when the beam scanning is effected in the obtained direction for each second predetermined pitch and convert the third electron signals to third video signals, and differential smoothing the third video signals to calculate a sum of absolute values of the third video signals for each second predetermined pitch, thus to determine a second excitation condition of the objective lens on the basis of the calculated sum of the absolute values of the third video signals; and determining the focal distance of the objective lens on the basis of the second excitation condition.

DETAILED DESCRIPTION OF THE PREFERRED EMBODIMENTS

Figure 2:
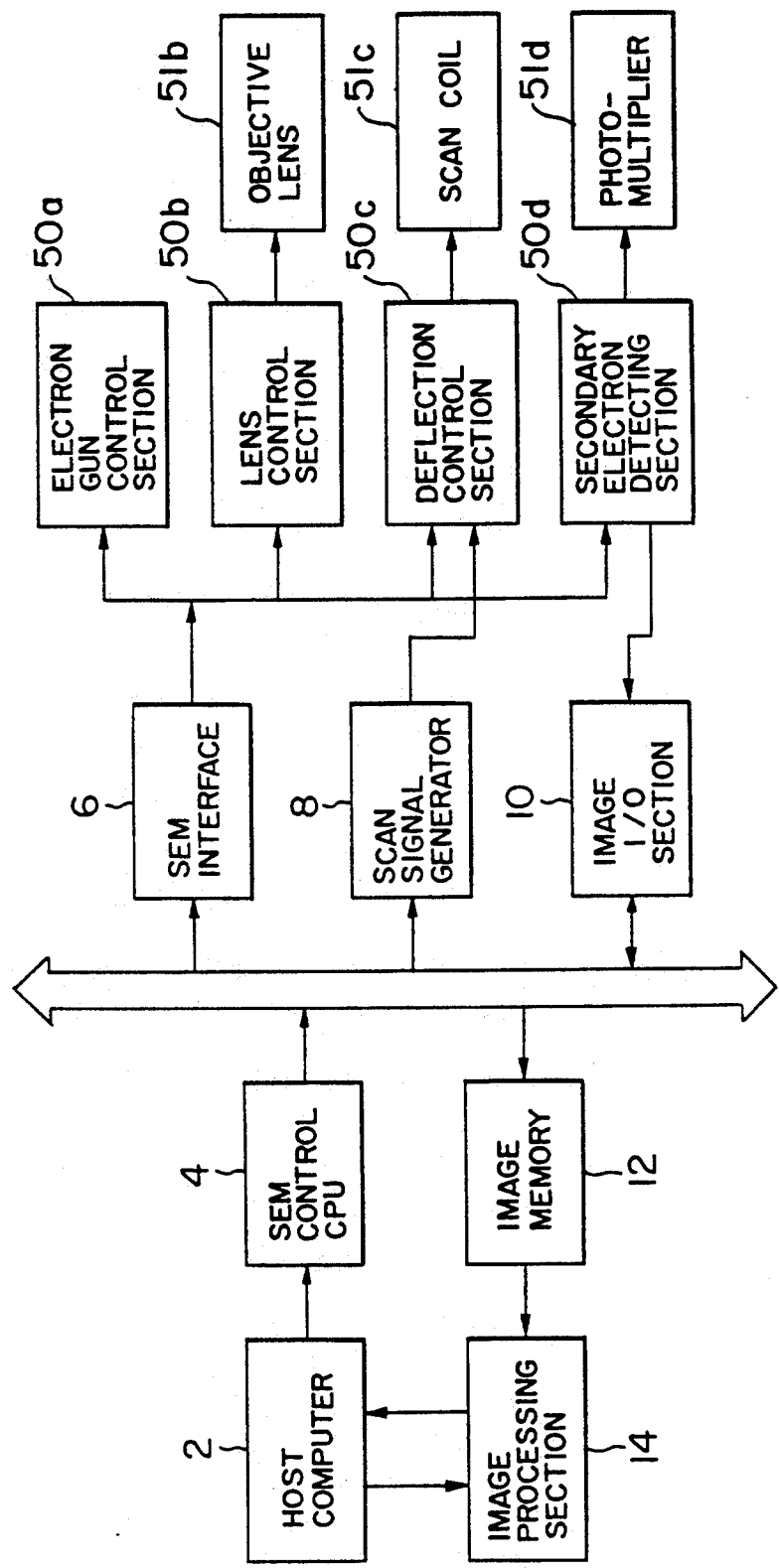
FIG. 2 is a block diagram showing the essential system configuration for executing the method of the present invention.

An embodiment of the automatic focusing method of the present invention will be described hereinbelow with reference to the attached drawings. As depicted in FIG. 2, the automatic focusing method of the present invention is executed by use of a scanning electron microscope (SEM), which comprises an electron gun control section 50a, a lens control section 50b, a deflection control section 50c and a secondary electron detecting section 50d.

Figure 1:
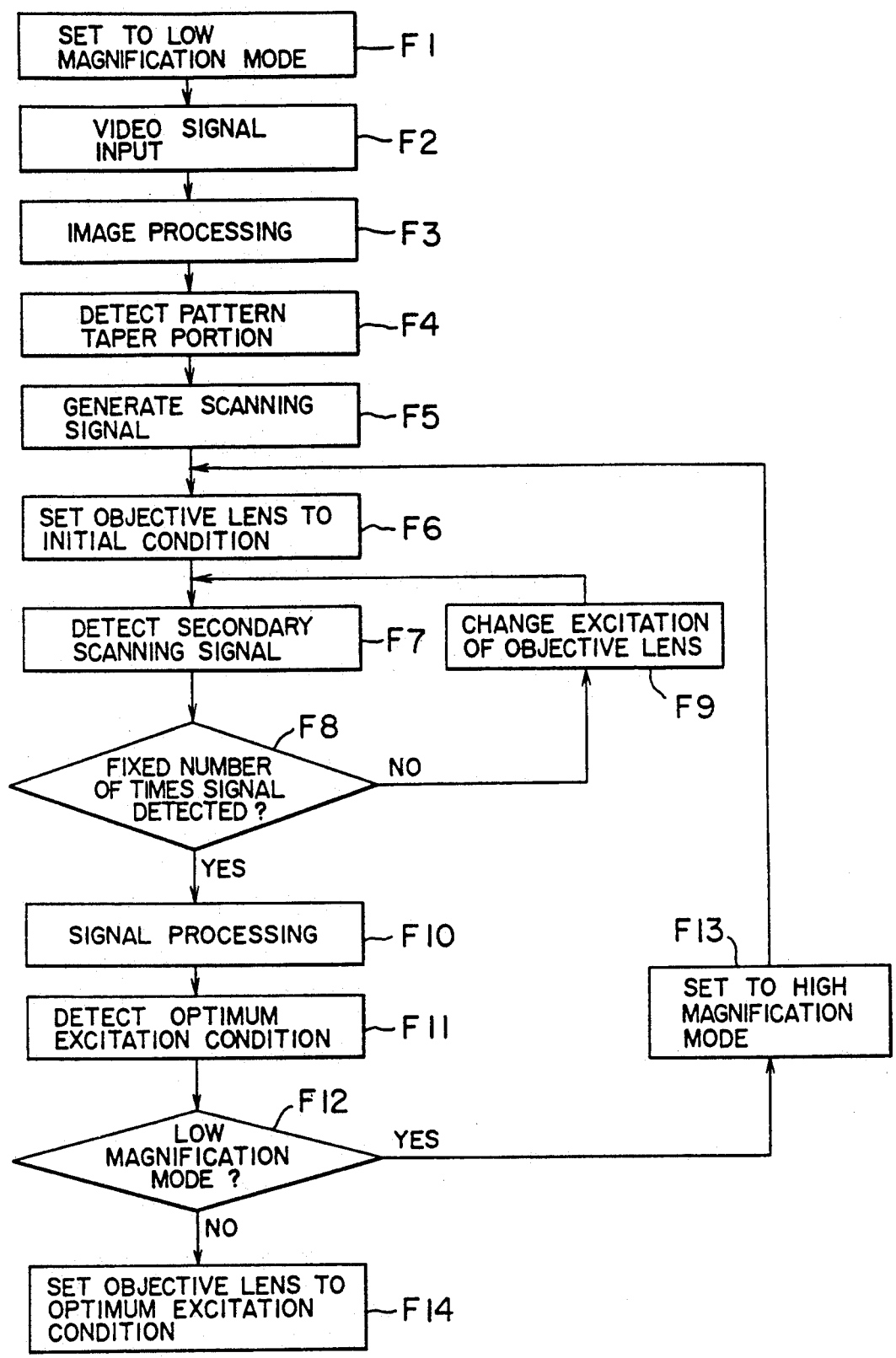
FIG. 1 is a flowchart showing the processing procedure of the automatic focusing method according to the present invention.

With reference to FIG. 1, the scanning electron microscope is first set to a low magnification mode ($\times 5000$) (in step F1). In this low magnification mode, a beam scanning is effected upon an object to be observed (not shown). This beam scanning is effected when a SEM control CPU 4 controls the electron gun control section 50a, the lens control section 50b and the deflection control section 50c through a SEM interface 6 on the basis of command signals applied from a host computer 2. That is, electron beams generated through the electron gun control system 50a is deflected by the scanning coil 51c, and then irradiated upon the object via the objective lens 51b.

Secondary electron signals obtained from the object due to the above-mentioned beam scanning is, via a photomultiplier 51d, detected by the secondary electron detecting system 50d. The detected secondary electron signals are converted into video signals by an image input and output section 10, and then stored in an image memory 12 (in step F2).

Successively, the video signals are processed by an image processing section 14 (in step F3). In this image processing, the video signals are filtered through a spatial filter of $3 \times 3$ filter matrix in order to make smooth the image signal.

Figure 3C:
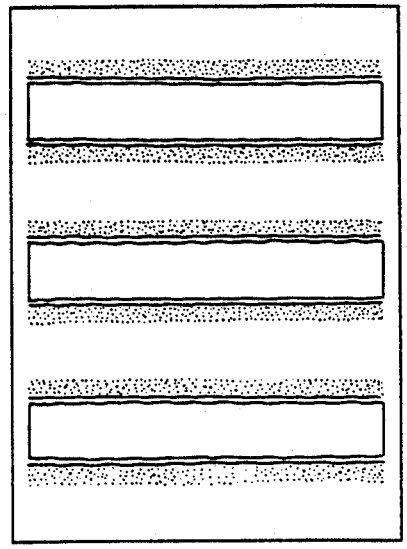
FIGS. 3A to 3D are pictorial views depicting images and their signal distribution obtained by the image processing of the method of the present invention.
Figure 3D:
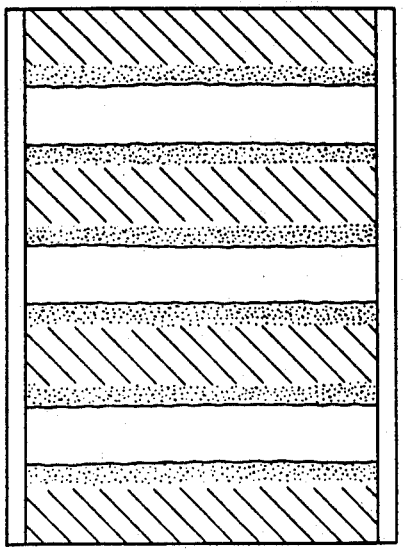
Figure 3A:
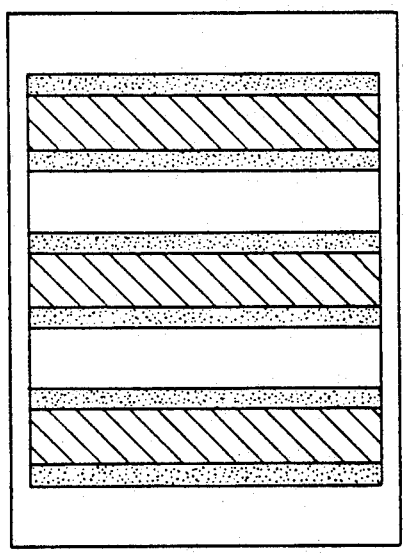
Figure 3B:
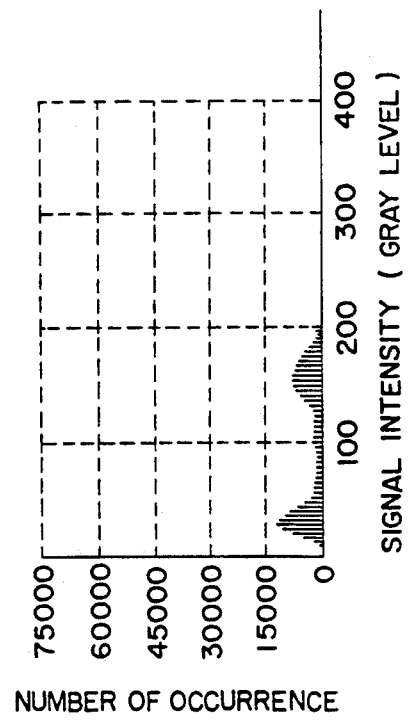

FIG. 3A shows an image of the object obtained by the process in step 3. And the histogram of the image is shown in FIG. 3B. It is found from FIG. 3B that the peak value of the signal intensity (gray level) of the image exists in the vicinity of 30. 150. The image is then separated into three regions of surface portions of the object, projecting surface portions of the object on the surface portions, and taper portions of the object formed between the surface portions and the projecting surface portions through the multivalue processing (e.g. three value-processing) in accordance with the density (light and shade) values of the image.

FIG. 3C shows an image of the object obtained by the three value-processing. In FIG. 3C, the surface portions, the taper portions and the projecting surface portions correspond to 0 (oblique line regions), intermediate levels (dot regions) and 255 (white regions), respectively.

Subsequently, the positions of the taper portions are detected by checking the multivalued image density values with the image processing section 14 (in step F4).

FIG. 3D shows the state where the positions of the taper portions are detected. The taper portion detection is conducted by the calculation using a Sobel filter with the following Soble operators:

$$X = \begin{matrix} -1 & 0 & 1 \\ -2 & 0 & 2 \\ -1 & 0 & 1 \end{matrix} \qquad Y = \begin{matrix} -1 & -2 & -1 \\ 0 & 0 & 0 \\ 1 & 2 & 1 \end{matrix}$$

The host computer 2 calculates the beam scanning direction perpendicular to the detected taper portions, and transmits the calculated direction data to a memory of a scanning signal generator 8 through the SEM control CPU 4. This direction can be obtained on the basis of the fact that the amplitude of the secondary signals obtained by the beam scanning becomes its maximum when the beam scanning direction is set perpendicular to the taper portion. On the basis of the above-mentioned data, the scanning signal generator 8 transmits a scanning control signal to the deflection control system 50c in order to achieve the beam scanning whose direction is perpendicular to the taper portion (in step F5).

Thereafter, the initial condition of exciting the objective lens 51b (e.g. zero or maximum excitation voltage) is set (in step F6). Further, whenever the voltage for exciting the objective lens 51b is varied by a constant value, one beam scanning is conducted by the scanning signal generator 8 (in steps F7, F8 and F9). At this time, the secondary electron signal detected by the secondary electron detecting section 50c is converted into video signal by the image input and output section 10 and then stored in the image memory 12. The stored video signal is processed by the image processing section 14 (in step F10). Here, when the image memory is composed of $512 \times 512$ pixels frame for instance, since the video signal can be stored at $512 \times 1$ contents for each excitation condition, it is possible to change the excitation condition of 512 kinds. Therefore, in step F9, the excitation voltage of the objective lens is changed at a constant rate in sequence so that the working distance can be changed at a constant pitch (at a pitch of 100 $\mu$m/512 in the case where the working distance is 100 $\mu$m, for instance). Further, in this processing, the image processing section 14 smoothes and differentiates the video signal data obtained by a single beam scanning stored in the image memory 12 under the condition that the objective lens excitation condition is kept constant, in order to detect the position of the taper portion of the object. In this case, the number of points (the number of the weight coefficients) at which the video signal is differential smoothed is seven, for instance. After the above-mentioned smoothing and differentiation processing, a sum total Si (i indicates the ordinal numbers of the objective lens excitation conditions) of pixel signal absolute values is calculated. By executing the above-mentioned processing for all the signal data obtained under all the excitation conditions, the host computer 2 calculates the optimum excitation condition imax in which the sum total Si of the absolute values is maximized (in step F11).

Figure 4:
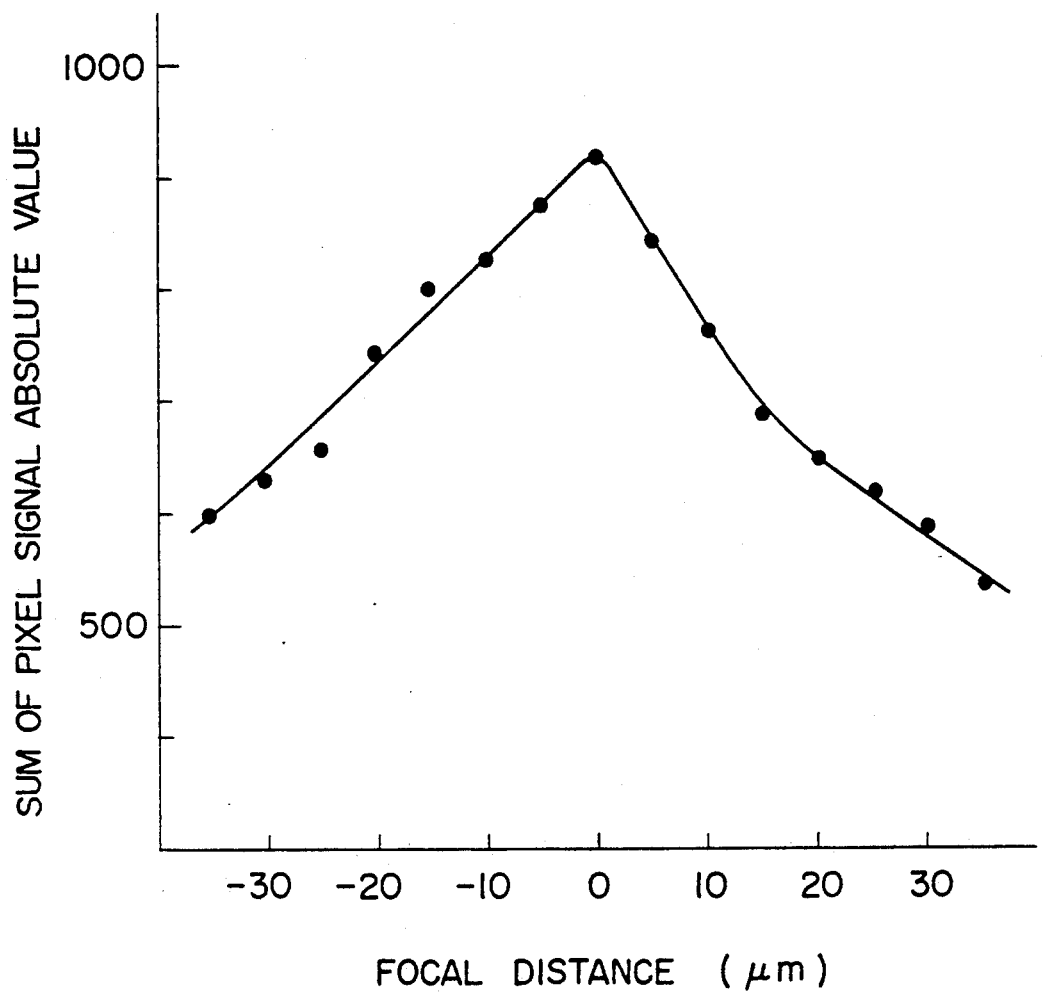
FIG. 4 is a graphical representation indicating the relationship between a focal distance and a sum of absolute values of pixel signals in the method of the present invention.

FIG. 4 shows the relationship between the focal distance of the objective lens and the sum of pixel signal absolute values after the smoothing and differentiation processing. The variation of the focal distance corresponds to the variation of the excitation current of the objective lens. As shown in FIG. 4, the sum of pixel signal absolute values becomes its maximum when the focal distance is 0 (just-focusing point). It is thus possible to detect the just-focusing state by setting the excitation current of the objective lens so that the sum of pixel signal absolute values becomes its maximum.

Thereafter, the scanning electron microscope is set to a high magnification mode ($\times 20000$) (in steps 12 and 13). The above-mentioned steps F6 and F12 are repeated in order to determine the optimum excitation condition in the high magnification mode.

In this processing, the objective lens excitation condition is changed at a pitch 1/10 times smaller than that in the low magnification mode, within a predetermined range with the optimum excitation condition imax obtained in the low magnification mode as the center of the range. That is, in this embodiment, the excitation condition of the objective lens is varied at a pitch of 1/10 of the pitch 100 μm/512 of the low magnification mode, within the optimum excitation condition imax obtained from the 512 excitation conditions as the center of the variation, in the case of the working distance of 100 μm.

Further, the host computer 2 controls the lens control section 50b through the SEM control CPU 4 and the SEM interface 6 so that the objective lens excitation condition is determined to the optimum excitation condition obtained in the high magnification mode, ending the automatic focusing operation (in step F14).

Further, when the excitation condition of the objective lens is varied, it is preferable to set the initial excitation condition to a weak current and then increase the excitation condition gradually to a strong current, in order to reduce the influence of the hysteresis of the objective lens. Further, it is preferable to once return the excitation condition to the initial value, before setting the objective lens to the obtained optimum condition.

Figure 5A:
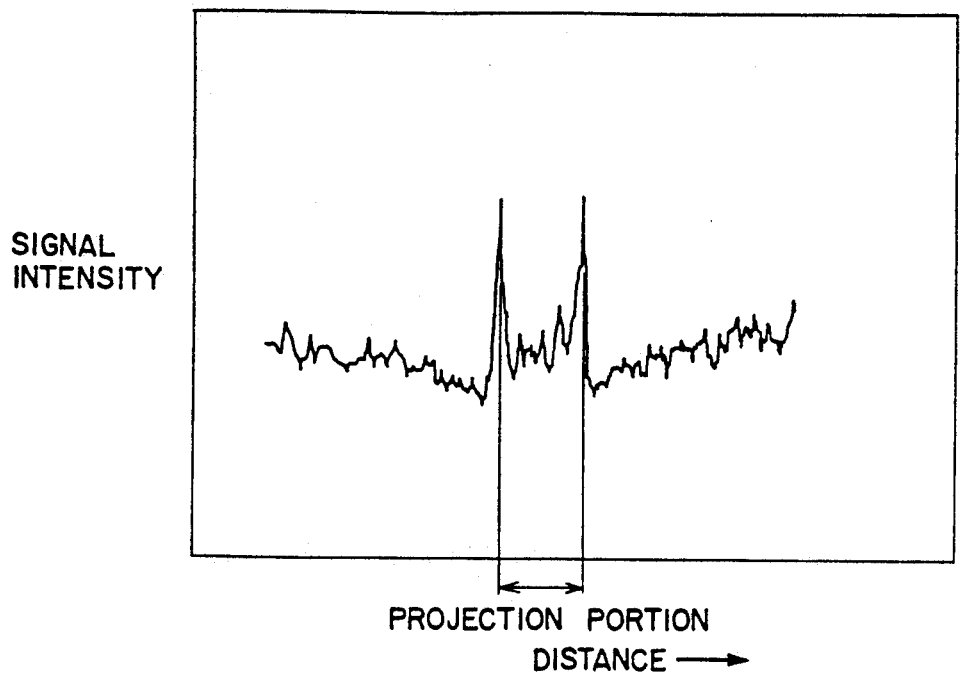
FIGS. 5A and 5B are graphical representations for assistance in explaining the effect of the method of the present invention.
Figure 5B:
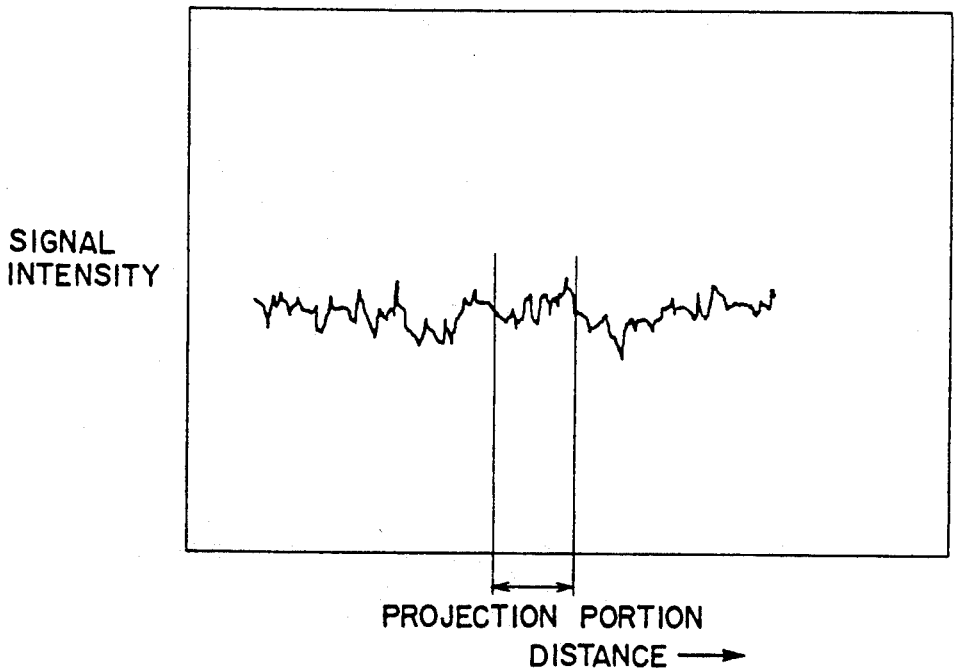

FIG. 5A shows the signal wave form indicative of the taper portion obtained after the automatic focusing operation has been executed in accordance with the method of the present invention, and FIG. 5B shows the same signal wave form indicative of the taper portion obtained before the automatic focusing operation is executed and therefore the image is out of focus with a blur. FIGS. 5A and 5B indicate that the automatic focusing method according to the present invention enables a precise focusing operation even when the topography of an object to be observed is different from each other and further the working distance varies markedly.

What is claimed is:

1. An automatic focusing method for scanning electron microscopy, comprising the steps of:
    setting a scanning electron microscope in a predetermined low magnification mode to scan electron beams upon an object to be observed via an objective lens of the microscope;
    detecting first secondary electron signals from the object to convert the first electron signals into first video signals;
    smoothing and multivalue processing the first video signals to separate a signal component corresponding to a taper portion of the object, thus to detect a position of the taper portion;
    obtaining a beam scanning direction perpendicular to the taper portion to deflect the beams in the obtained direction;
    changing a control condition of the objective lens at a first predetermined pitch to vary a focal distance of the objective lens, thus to detect second secondary electron signals obtained when the beam scanning is effected in the obtained direction for each first predetermined pitch and convert the second electron signals into second video signals;
    differential smoothing the second video signals to calculate a sum of absolute values of the second video signals for each first predetermined pitch, thus to determine a first excitation condition of the objective lens on the basis of the calculated sum of the absolute values of the second video signals;
    setting the microscope in a predetermined high magnification mode and changing the excitation condition at a second predetermined pitch within a predetermined range with the first excitation condition as a center of the range, to vary the focal distance, thus to detect third secondary electron signals obtained when the beam scanning is effected in the obtained direction for each second predetermined pitch and converting the third electron signals to third video signals, and differential smoothing the third video signals to calculate a sum of absolute values of the third video signals for each second predetermined pitch, thus to determine a second excitation condition of the objective lens on the basis of the calculated sum of the absolute values of the third video signals; and
    determining the focal distance of the objective lens on the basis of the second excitation condition.

2. A method according to claim 1, wherein the taper portion detection step comprises the step of three value-processing the smoothed first video signal to separate the three value-processed first video signal into signal components each corresponding to a surface portion of the object, a projecting surface portion of the object on the surface portion and a taper portion of the object formed between the surface portion and the projecting surface portion.

3. A method according to claim 1, wherein the second video signal conversion step comprises the step of changing the control condition of the objective lens at a predetermined pitch corresponding to a distance between the object and the objective lens.

* * * * *